(12) United States Patent
Flaig et al.

(10) Patent No.: US 11,146,036 B2
(45) Date of Patent: Oct. 12, 2021

(54) LASER CLOCK SIGNAL GENERATORS

(71) Applicant: TRUMPF LASER GMBH

(72) Inventors: Rainer Flaig, Eschbronn (DE);
Christian Stolzenburg, Constance (DE); Fred Stier, Schramberg (DE);
Daniel Moosmann, Schramberg (DE)

(73) Assignee: TRUMPF LASER GMBH, Schramberg (DE)

( * ) Notice: Subject to any disclaimer, the term of this patent is extended or adjusted under 35 U.S.C. 154(b) by 425 days.

(21) Appl. No.: 16/245,618

(22) Filed: Jan. 11, 2019

(65) Prior Publication Data

US 2019/0148907 A1 May 16, 2019

Related U.S. Application Data

(63) Continuation of application No. PCT/EP2017/067619, filed on Jul. 12, 2017.

(30) Foreign Application Priority Data

Jul. 14, 2016 (DE) .......................... 102016212927.9

(51) Int. Cl.
*H01S 3/00* (2006.01)
*H01S 3/10* (2006.01)
(Continued)

(52) U.S. Cl.
CPC ........ *H01S 3/10015* (2013.01); *H01S 3/2308* (2013.01); *H01S 3/2375* (2013.01); *H01S 5/0428* (2013.01); *H01S 5/06216* (2013.01)

(58) Field of Classification Search
CPC .. H01S 5/06216; H01S 5/0428; H01S 3/2375; H01S 3/10015; H01S 3/2308
(Continued)

(56) References Cited

U.S. PATENT DOCUMENTS 9,048,622 B2 6/2015 Nakai
2002/0126270 A1* 9/2002 Chien .................... G01S 7/487
356/5.01
(Continued)

FOREIGN PATENT DOCUMENTS

CN 202094795 U 12/2011
CN 104488147 4/2015
(Continued)

OTHER PUBLICATIONS

CN Office Action in Chinese Appln. No. 201780043585, dated Jun. 29, 2020, 17 pages (with English translation).
(Continued)

*Primary Examiner* — Mark Hellner
(74) *Attorney, Agent, or Firm* — Fish & Richardson P.C.

(57) ABSTRACT

A laser clock signal generator for controlling a laser beam generator to generate pulse laser radiation is provided. The laser clock signal generator includes a clock signal specification input arranged to receive an external clock specification signal, a basic clock signal generator configured to generate a basic clock signal based on the external clock specification signal and output the basic lock signal at a clock signal output to the laser beam generator, and a controller configured to control the basic clock generator, for example, to be synchronized with the external clock specification signal. The laser clock signal generator also includes an overclocking protector arranged between the basic clock generator and the clock signal output.

21 Claims, 2 Drawing Sheets

(51) Int. Cl.
*H01S 3/23* (2006.01)
*H01S 5/042* (2006.01)
*H01S 5/062* (2006.01)

(58) Field of Classification Search
USPC ..................................................... 359/341.1
See application file for complete search history.

(56) References Cited

U.S. PATENT DOCUMENTS

| | | |
|---|---|---|
| 2005/0225846 A1 | 10/2005 | Nati et al. |
| 2006/0129867 A1* | 6/2006 | Brodsky .................. H03K 5/19 |
| | | 713/500 |
| 2011/0019705 A1 | 1/2011 | Adams et al. |
| 2013/0272325 A1 | 10/2013 | Rosenthal et al. |
| 2015/0043599 A1 | 2/2015 | Yanagida et al. |
| 2019/0148907 A1 | 5/2019 | Flaig et al. |

FOREIGN PATENT DOCUMENTS

| | | | | |
|---|---|---|---|---|
| CN | 105447413 | | 3/2016 | |
| CN | 109478759 A | | 3/2019 | |
| DE | 102016212927 | | 9/2017 | |
| JP | 2013026377 A | * | 2/2013 | ....... H01S 3/094076 |
| WO | WO 2015/006867 | | 1/2015 | |

OTHER PUBLICATIONS

CN Search Report in Chinese Appln. No. 201780043585, dated Jun. 19, 2020, 2 pages.
International Search report and Written Opinion in International Application No. PCT/EP2017/067619, dated Jan. 9, 2018, 19 pages (with English translation).

* cited by examiner

LASER CLOCK SIGNAL GENERATORS

CROSS REFERENCE TO RELATED APPLICATIONS

This application is a continuation of and claims priority under 35 U.S.C. § 120 from PCT Application No. PCT/EP2017/067619 filed on Jul. 12, 2017, which claims priority from German Application No. DE 10 2016 212 927.9 filed on Jul. 14, 2016. The entire contents of each of these priority applications are incorporated herein by reference.

TECHNICAL FIELD

The present disclosure relates to laser clock signal generators for controlling a laser beam generator to generate pulsed laser radiation and laser systems having such laser clock signal generators.

BACKGROUND

The generation of pulsed laser radiation is generally based on an electronically produced master clock. As a result of the laser properties, the master clock is subjected to precise timing requirements with respect to frequency and phase position since fluctuations of the master clock may lead to energy fluctuations or damage to the laser. A rigid clock specification is, however, insufficient for many applications. There is often desired a pulse which is requested by an external signal, a so-called pulse on demand.

SUMMARY

One aspect of the present disclosure is to provide a laser clock signal generator by which the above-mentioned requirements can be complied with.

Another aspect of the present disclosure features a laser clock signal generator for controlling a laser beam generator for generating pulsed laser radiation. The laser clock signal generator includes a clock signal output which can be supplied to the laser beam generator or connected thereto, a basic clock generator configured to generate a basic clock signal which can be output at the clock signal output, and a clock specification signal input for inputting an external clock specification signal. The laser clock signal generator has a control unit configured to control the basic clock generator, e.g., to be synchronized with the external clock specification signal, and an overclocking protection device is arranged between the basic clock generator and the clock signal output. Via the control unit, the basic clock generator can be adjusted finely, in particular to precisely 16 bit, quite particularly to 32 bit precisely, so that a precise basic clock signal can be generated. The term "precise basic clock signal" is intended in this instance to be understood to refer to a basic clock signal which has a jitter of less than 50 ns, in particular less than 10 ns. To prevent damage to the laser in the event of overclocking, that is to say, an excessively high clock frequency, the overclocking protection device is provided. It can thereby be ensured that laser pulse formation times in an optical amplifier, for example, in a pumped fiber amplifier, cavity dumped or regenerative amplifier system, are maintained. The overclocking protection device may be constructed as a so-called retrigger lock-out. A retrigger lock-out may be constructed to prevent restarting of a pulse, brought about by an external signal (retriggering), for a predetermined period of time or under predetermined conditions. In the present clock signal generator, the retrigger lock-out may in particular be constructed to prevent restarting of a basic clock signal brought about by a pulse frequency signal at the input of the overclocking protection device for the time of a predetermined minimum pulse duration which is determined by a maximum frequency. The condition may, for example, be the duration of the output pulse itself. However, the condition may also, for example, be a state of an optical amplifier which is intended to be pumped by the pulse.

The basic clock generator may have a ring accumulator and a frequency register which is associated therewith. The control unit can write into the frequency register which controls the ring accumulator. The data value adjusted in the frequency register may be adjusted in such a manner that the basic clock signal does not fall below a predetermined minimum frequency. The ring accumulator may be constructed as a shift register, in particular as a series connection of a plurality of digital flip-flops with return of the last flip-flop output to the input of the first flip-flop. It may be controlled at an operating frequency and may increase or decrease an accumulator value in the cycle of the operating frequency. In this instance, the value stored in the frequency register is decisive for the step height of the increase or decrease.

The ring accumulator may be realized in a logic module, in particular a field-programmable gate array (FPGA). When the ring accumulator overruns, that is to say, in the event of a rollover of the ring accumulator, there is preferably produced the generation of a flank, in particular a rising flank, of the basic clock signal.

The basic clock generator may have a synchronization input for synchronization with the clock specification signal—where applicable after the debouncing of the clock specification signal. As a result of the clock specification signal which is supplied to the synchronization input, it is, for example, possible for a premature roll-over of the ring accumulator to be brought about or for the ring accumulator to be reset in such a manner that a flank of the basic clock signal is produced.

A logic unit which can be controlled by the control unit may be provided between the clock specification signal input and the basic clock generator, in particular the synchronization input. In particular, a plurality of signals may be logically linked by the logic unit to produce a synchronization signal. The clock specification signal may, depending on the logical linking of other signals, also be looped through and used as a synchronization signal.

A measurement device for detecting the frequency of the clock specification signal may be provided. In particular, this measurement device may be integrated in the control unit.

A first limitation device for suppressing clock specification signals at a frequency over a predetermined frequency may be provided. Consequently, an external triggering of the basic clock generator may be prevented if the frequency of the external clock specification signal is excessively high. The limitation device may be constructed as a so-called blocking timer.

Furthermore, a second limitation device for suppressing clock specification signals at a frequency below a predetermined second frequency may be provided. In particular, the data value which is adjusted in the frequency register may be increased by the second limitation device to ensure that it does not fall below a predetermined second frequency. Consequently, damage to the laser as a result of underclocking, that is to say, an excessively low clock frequency, may be prevented.

The second limitation device may therefore be connected to the basic clock generator to reduce the frequency of the basic clock signal as required. Thus, after a first completed synchronization, it is also possible to clock at a clock frequency which is lower than the one adjusted by the frequency register.

Furthermore, a clock stabilization device may be provided. By the clock stabilization unit the frequency of direct synchronization sequences at an excessively high frequency may be limited.

The clock signal generator may have a monitoring device for monitoring with regard to the presence of a clock specification signal. In this instance, the monitoring device may be constructed as a so-called state machine. If it is determined by the monitoring device that no clock specification signal is present, a frequency reduction of the basic clock signal can automatically be cancelled. This means that a direct automatic basic clock takeover can be carried out in the event of failure of the external clock specification signal.

Furthermore, a monitoring device for monitoring the synchronization of the basic clock generator to the clock specification signal may be provided. This monitoring device may be integrated in the control unit.

Furthermore, a clock flank debouncing may be provided. It is thereby possible to prevent an incorrect triggering. The clock flank debouncing may be constructed as an FPGA filter. The term FPGA filter is intended in this instance to refer to a digital filter which is produced in the logic module, in particular in the FPGA.

The clock signal generator may be constructed in the logic module, in particular in the FPGA. With the clock signal generator according to the present disclosure, an external clock specification signal can be processed. A clock signal which is intended to be supplied to the laser beam generator may be parametrized, released and monitored. A minimum and maximum frequency limitation may be produced. Furthermore, a synchronization window may be determined, in which the clock specification signal can be freely triggered. This is advantageous for pulse-on-demand applications.

In particular, there may be provision for the clock specification signal to be output by the clock signal generator as a clock signal if it is within a predetermined frequency range. Furthermore, the generated basic clock signal can be output as a clock signal if no clock specification signal is present. The basic clock generator may be synchronized with the clock specification signal if one is present.

Other features and advantages of the present disclosure will be appreciated from the following detailed description of embodiments of the present disclosure, with reference to the Figures of the drawings, which sets out details which are significant to the present disclosure, and from the claims. The features shown therein are not necessarily intended to be understood to be to scale and are illustrated in such a manner that the specific features according to the present disclosure can be made clearly visible. The different features may be implemented individually per se or together in any combinations in variants of the present disclosure.

Another aspect of the present disclosure features a laser system having a laser clock signal generator as described above. The laser system may further have: a pulse generator, a laser excitation unit, and an optical amplifier. The components of the laser system, their cooperation and their function are described in greater detail in connection with the description of the Figures.

Embodiments of the present disclosure are illustrated in the schematic drawings and explained in greater detail in the following description.

DETAILED DESCRIPTION

Figure 1:
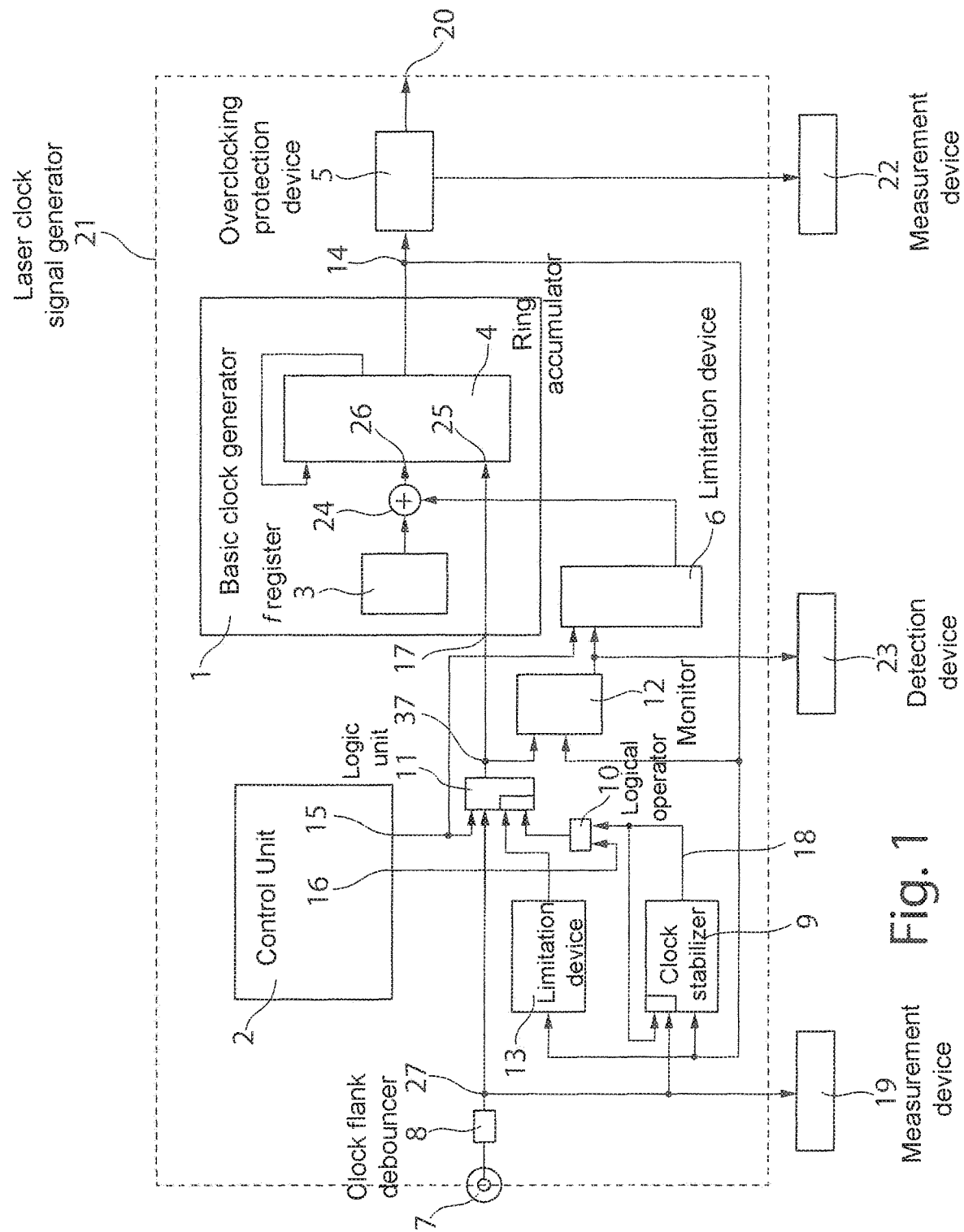
FIG. 1 shows a laser clock signal generator.

FIG. 1 shows a laser clock signal generator 21. This has a basic clock generator 1, a control unit (or controller) 2, an overclocking protection device (or overclocking protector) 5 and additional logic modules. The laser clock signal generator 21 is operated at an operating frequency. The operating frequency can be greater than 80 MHz, in particular greater than 150 MHz, and is particularly preferably 192 MHz. Consequently, a jitter of less than 10 ns can be achieved.

The basic clock generator 1 has a ring accumulator 4, a frequency register (or f register) 3, an adder 24 and a synchronization input 17. The control unit 2 may write into the frequency register 3, for example, a 32 bit value. The ring accumulator 4 is controlled by the frequency register 3. The ring accumulator 4 is operated at the operating frequency of the laser clock signal generator 21. The value of the frequency register 3 is, in particular in the cycle of the operating frequency, sent via the adder 24 to the ring accumulator 4. In the adder 24, if necessary, a value can be added to the value from the frequency register 3. The frequency adjustment value 26 generated in this manner reaches the ring accumulator 4. The higher the value is, the higher the frequency which the ring accumulator 4 produces and outputs as a pulse frequency signal 14. The pulse frequency signal 14 travels from the output of the ring accumulator 4 to the output of the basic clock generator 1. From the output of the basic clock generator 1, the pulse frequency signal 14 reaches the input of the overclocking protection device 5. A signal which reaches the synchronization input 17 is guided to a roll-over precontrol 25 of the ring accumulator 4. The signal from the synchronization input 17 leads to a frequency at the output of the ring accumulator 4 which extends synchronously with the signal from the synchronization input 17 when the frequency of the signal from the synchronization input 17 is greater than or equal to the frequency which is adjusted in the ring accumulator 4 by the frequency adjustment value 26. However, if the signal from the synchronization input 17 has a frequency which is less than the frequency adjusted by the frequency adjustment value 26, the frequency of the pulse frequency signal 14 is determined by the frequency adjustment value 26.

The control unit 2 has a plurality of digital signal inputs and signal outputs. It is illustrated in the embodiment in a state distributed over a plurality of subassemblies which are indicated with the reference numerals 2, 22, 23, 19 and described in greater detail below. From a plurality of signal outputs, only two, that is to say, that of a clock release signal 15 and that of a clock stabilization release signal 16, are shown and also described in greater detail below. The control unit 2 may be part of the basic clock generator 1 or be arranged externally with respect thereto.

The laser clock signal generator 21 further has a clock specification signal input 7 via which an external clock specification signal can be input. This clock specification signal first reaches a clock flank debouncing device (or debouncer) 8. The clock flank debouncing device 8 may have a deep-pass filter and a Schmitt-trigger module, but it may also be produced with other logic modules, such as RS flip-flop, monostable flip-flop or similar circuits. Thus, with the clock flank debouncing device 8, an incorrect triggering as a result of interference signals or excessively slow increase of the voltage with the clock specification signal can be prevented. The clock flank debouncing device 8 produces at the output thereof the debounced clock specification signal 27.

A first measurement device 19 which may be integrated in the control unit 2 can establish the frequency of the debounced clock specification signal 27.

The debounced clock specification signal 27 travels from the clock flank debouncing device 8 to a logic unit 11. The logic unit 11 may have an AND gate, a NAND gate, an OR gate, a NOR gate, an EXOR gate, or a combination of these logic gates. The logic unit 11 may be constructed as a gate circuit for the external triggering. In dependence on a linking to other signals or the logical linking of other signals, it gives a synchronization signal 37 to the synchronization input 17.

For example, the control unit 2 with the clock release signal 15 which is generated thereby and which is also supplied to the logic unit 11 may prevent or permit a forwarding of the debounced clock specification signal 27 to the synchronization input 17. The control unit 2 establishes, for example, the frequency of the debounced clock specification signal 27. When the control unit 2 in this instance, for example, establishes an excessively high frequency, it may prevent the forwarding of the debounced clock specification signal 27 as the synchronization signal 37 to the synchronization input 17. As will be described in greater detail below, the control unit 2 may also establish other signals. The control unit 2 may also evaluate these signals and as a result of the evaluation prevent or permit the forwarding of the debounced clock specification signal 27 as the synchronization signal 37 to the synchronization input 17. The synchronization signal 37 may, when it reaches the synchronization input 17, reset the ring accumulator 4 of the basic clock generator 1 or bring about a roll over. In this manner, the pulse frequency signal 14 is generated at the output of the basic clock generator 1 as a basic clock signal which is synchronized with the clock specification signal 7. The output signal of the basic clock signal generator 1 is supplied to the overclocking protection device 5, which detects and blocks excessively high clock frequencies. In this manner, damage to a laser can be prevented. At the clock signal output 20, the basic clock signal is output. The basic clock signal corresponds to the pulse frequency signal 14 if it is in a permissible range. If the pulse frequency signal 14 is not in a permissible frequency range, a basic clock signal at a frequency in the permissible frequency range, for example, a highest possible integral factor of the frequency of the pulse frequency signal, is output at the clock signal output 20.

By a second measurement device 22 which may be integrated in the control unit 2 and which can establish the behavior, in particular the frequency, of the pulse frequency signal 14 at the output of the basic clock generator 1, excessively fast triggerings can be detected.

The pulse frequency signal 14 which is applied at the output of the basic cycle generator 1 is returned to a clock stabilization device (or clock stabilizer) 9. The debounced clock specification signal 27 may also be supplied to the clock stabilization device 9. The clock stabilization device 9 may, in the event of occurrences of incorrect triggering, limit the sequence of rapid clock latching processes, in particular using a binary counter. To this end, the clock stabilization output signal 18 of the clock stabilization device 9 may be supplied to a logical operator 10. The clock stabilization device 9 may have a binary counter, in particular a 16 bit counter. The debounced clock specification signal 27 may be used to reset this counter. The clock stabilization device 9, in particular the counter, may be operated at the operating frequency of the clock signal generator 21. The pulse frequency signal 14 may be used as a signal for triggering the counter.

The logic operator 10 may have an AND gate, a NAND gate, an OR gate, an NOR gate, an EXOR gate, or a combination of these logic gates. The clock stabilization release signal 16 from the control unit 2 may further be supplied to the logical operator 10. The output of the logical operator 10 may be supplied to the logic unit 11. The clock stabilization device 9 can thus also prevent or permit a forwarding of the debounced clock specification signal 27 to the synchronization input 17. The control unit 2 may also influence whether the debounced clock specification signal 27 to the synchronization input 17 is prevented or permitted.

The pulse frequency signal 14 at the output of the basic cycle generator 1 is further supplied to a first limitation device 13. The limitation device 13 may have a binary counter, in particular a 32-bit counter. The pulse frequency signal 14 may be used to reset this counter. The pulse frequency signal 14 may also be used as a signal to trigger the counter. The limitation device 13, in particular the counter, may be operated at the operating frequency of the laser clock signal generator 21. The limitation device 13 serves to suppress clock specification signals 7 at a frequency above a predetermined frequency. The output of the first limitation device 13 is in turn supplied to the logic unit 11. The limitation device 13 may thus also prevent or permit a forwarding of the debounced clock specification signal 27 to the synchronization input 17, The pulse frequency signal 14 at the output of the basic cycle generator 1 is further supplied to a monitoring device (or monitor) 12. The monitoring device 12 may be constructed as a state machine and may thus carry out a monitoring with regard to the presence of a clock specification signal 7, a debounced clock specification signal 27 or in particular the synchronization signal 37. To this end, the synchronization signal 37 may in particular be supplied to the monitoring device 12. The monitoring device 12 may have a binary counter, in particular a 2-bit counter. The synchronization signal 37 may be used to reset this counter. The pulse frequency signal 14 may be used as a signal for triggering the counter. The monitoring device 12, in particular the counter, may be operated at the operating frequency of the clock signal generator 21. The monitoring device 12 is connected to a second limitation device 6, in particular the output signal thereof is supplied to the second limitation device 6. It is thereby possible to suppress clock specification signals 7 at a frequency below a predetermined second frequency. To this end, the second limitation device 6 is connected to the basic clock generator 1. In particular, the output of the limitation device 6 may be connected to the adder 24 of the basic clock generator 1. It is thereby possible to carry out a frequency increase of the basic clock, that is to say, the pulse frequency signal 14, with a successful external clock specification.

The output signal of the monitoring device 12 may be detected by a detection device (or detector) 23 which can be integrated in the control unit 2. Via the detected signal of the detection device 23, the control unit 2 can identify whether or not a synchronization has taken place with the signal at the synchronization input 17.

The control unit 2 can thus release a new synchronization if it has been identified that a synchronization has been carried out with the clock specification signal. The control unit 2 can thus also prevent a new synchronization if it has been identified that a synchronization with the clock specification signal has not been carried out. To this end, the control unit 2 is connected to the logic unit 11.

Figure 2:
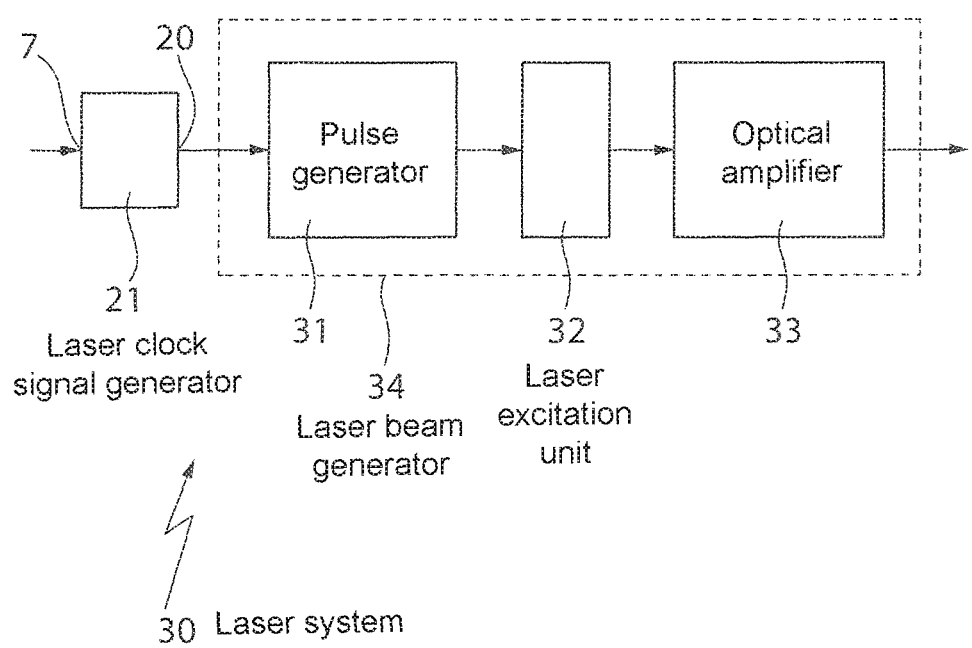
FIG. 2 shows a laser system having such a laser clock signal generator.

FIG. 2 shows a laser system 30 which has a laser clock signal generator 21 described above. The clock signal output 20 may be connected to a pulse generator 31 so that the clock signal can be supplied to the pulse generator 31. The pulse generator 31 is configured to produce in the cycle of the clock signal a signal with a predetermined power to control a laser excitation unit (or laser excitator) 32. The laser excitation unit 32 may itself be a laser diode. The output of the pulse generator 31 may be connected to a laser excitation unit 32, in particular a laser diode, as shown in FIG. 2. The laser pulse produced by the laser diode may be supplied to an optical amplifier 33 (e.g., pumped fiber amplifier, cavity dumped or regenerative amplifier system, etc.), as shown in FIG. 2. The optical amplifier 33 may produce a laser pulse for processing workpieces or other thermal or optical processes whose optical power is a number of times greater than the power of the laser excitation unit 32. As already described above, it is important that the system 30 runs in a fail-safe manner. It must therefore be operated only within specific frequency ranges. The pulse generator 31, laser excitation unit 32 and optical amplifier 33 constitute a laser beam generator 34.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

What is claimed is:

1. A laser clock signal generator for controlling a laser beam generator to generate pulsed laser radiation, the laser clock signal generator comprising:
   a clock signal specification input arranged to receive an external clock specification signal;
   a basic clock signal generator configured to generate a basic clock signal based on the external clock specification signal and output the basic clock signal at a clock signal output to the laser beam generator;
   a controller configured to control the basic clock generator;
   a logic unit between the clock specification signal input and the basic clock generator, wherein the logic unit is controllable by the controller; and
   an overclocking protector arranged between the basic clock generator and the clock signal output.

2. The laser clock signal generator of claim 1, wherein the basic clock generator comprises a ring accumulator and a frequency register associated with the ring accumulator.

3. The laser clock signal generator of claim 1, wherein the basic clock generator comprises a synchronization input for synchronization with the external clock specification signal.

4. The laser clock signal generator of claim 1, further comprising a measurement device configured to detect a frequency of the external clock specification signal.

5. The laser clock signal generator of claim 1, further comprising a limitation device configured to suppress clock specification signals at a frequency over a predetermined frequency.

6. The laser clock signal generator of claim 1, further comprising a limitation device configured to suppress clock specification signals at a frequency below a predetermined frequency.

7. The laser clock signal generator of claim 6, wherein the limitation device is connected to the basic clock generator and configured to reduce a frequency of the basic clock signal.

8. The laser clock signal generator of claim 1, further comprising a clock stabilization device configured to limit a sequence of rapid clock latching processes in an event of occurrences of incorrect triggering.

9. The laser clock signal generator of claim 1, further comprising a monitoring device configured to monitor a presence of the external clock specification signal.

10. The laser clock signal generator of claim 1, further comprising a monitoring device configured to monitor the synchronization of the basic clock generator with the external clock specification signal.

11. The laser clock signal generator of claim 1, further comprising a clock flank debouncing device configured to prevent an incorrect triggering by the external clock specification signal.

12. A laser system comprising:
   a laser beam generator configured to generate pulse laser radiation; and
   a laser clock signal generator configured to control the laser beam generator, the laser clock signal generator having:
      a clock signal specification input arranged to receive an external clock specification signal;
      a basic clock signal generator configured to generate a basic clock signal based on the external clock specification signal and output the basic clock signal at a clock signal output to the laser beam generator;
      a controller configured to control the basic clock signal generator; and
      an overclocking protector arranged between the basic clock signal generator and the clock signal output,
      wherein the laser clock signal generator further comprises at least one of:
         a logic unit between the clock specification signal input and the basic clock generator, wherein the logic unit is controllable by the controller, or
         a limitation device configured to suppress clock specification signals at a frequency over a predetermined frequency.

13. The laser system of claim 12, wherein the laser beam generator comprises:
   a laser excitation unit, and
   a pulse generator configured to produce in a cycle of the basic clock signal a signal with a predetermined power to control the laser excitation unit.

14. The laser system of claim 12, wherein the laser beam generator comprises an optical amplifier coupled to amplify an output power of the laser excitation unit.

15. A method of generating clock signals by a laser clock signal generator, the method comprising:
   receiving, at a clock signal specification input, an external clock specification signal;
   generating, by a basic clock signal generator, a basic clock signal based on the external clock specification signal;

controlling, by a controller, the basic clock signal generator; and outputting, at a clock signal output, the basic clock signal to a laser beam generator such that the laser beam generator generates pulsed laser radiation according to the basic clock signal, wherein the laser clock signal generator comprises at least one of:
- a logic unit between the clock specification signal input and the basic clock generator, wherein the logic unit is controllable by the controller, or
- a limitation device configured to suppress clock specification signals at a frequency over a predetermined frequency.

16. The method of claim 15, wherein the laser clock signal generator has an overclocking protector arranged between the basic clock signal generator and the clock signal output.

17. The method of claim 16, further comprising:
detecting a clock frequency of the outputted basic clock signal; and
in response to detecting that the clock frequency is higher than a predetermined threshold, preventing restarting of the outputted basic clock signal at an input of the overclocking protector for a predetermined pulse duration.

18. The method of claim 15, wherein controlling the basic clock signal generator comprises:
controlling the basic clock signal generator to be in synchronization with the external clock specification signal.

19. A laser clock signal generator for controlling a laser beam generator to generate pulsed laser radiation, the laser clock signal generator comprising:
a clock signal specification input arranged to receive an external clock specification signal;
a basic clock signal generator configured to generate a basic clock signal based on the external clock specification signal and output the basic clock signal at a clock signal output to the laser beam generator;
a controller configured to control the basic clock generator;
an overclocking protector arranged between the basic clock generator and the clock signal output; and
a limitation device configured to suppress clock specification signals at a frequency over a predetermined frequency.

20. A laser clock signal generator for controlling a laser beam generator to generate pulsed laser radiation, the laser clock signal generator comprising:
a clock signal specification input arranged to receive an external clock specification signal;
a basic clock signal generator configured to generate a basic clock signal based on the external clock specification signal and output the basic clock signal at a clock signal output to the laser beam generator;
a controller configured to control the basic clock generator; and
an overclocking protector arranged between the basic clock generator and the clock signal output,
wherein the laser clock signal generator comprises at least one of:
- a ring accumulator and a frequency register associated with the ring accumulator,
- a measurement device configured to detect a frequency of the external clock specification signal,
- a clock stabilization device configured to limit a sequence of rapid clock latching processes in an event of occurrences of incorrect triggering,
- a limitation device configured to suppress clock specification signals at a frequency below a predetermined frequency,
- a first monitoring device configured to monitor a presence of the external clock specification signal,
- a second monitoring device configured to monitor the synchronization of the basic clock generator with the external clock specification signal, or
- a clock flank debouncing device configured to prevent an incorrect triggering by the external clock specification signal.

21. The laser clock signal generator of claim 20, wherein the limitation device is connected to the basic clock generator and configured to reduce a frequency of the basic clock signal.

* * * * *